United States Patent [19]

Suzuki

[11] Patent Number: 5,323,821

[45] Date of Patent: Jun. 28, 1994

[54] SUCTION TABLE APPARATUS OF A NUMERICAL CONTROL ROUTER

[75] Inventor: Nobuyoshi Suzuki, Shizuoka, Japan

[73] Assignee: Heian Corporation, Shizuoka, Japan

[21] Appl. No.: 994,549

[22] Filed: Dec. 21, 1992

[51] Int. Cl.$^5$ .................. B23B 7/04; B23B 11/00
[52] U.S. Cl. .................... 144/1 A; 83/451;
  144/286 A; 269/21; 269/289 R
[58] Field of Search .......... 144/1 R, 1 A, 2 R, 286 R,
  144/286 A; 269/21, 289 R; 83/14, 19, 56, 422,
  451, 939, 941; 409/189, 192, 216, 201, 203, 903

[56] References Cited

U.S. PATENT DOCUMENTS

| 4,313,478 | 2/1982 | Suzuki | 144/1 A |
|---|---|---|---|
| 4,695,044 | 9/1987 | Nishihama | 269/21 |
| 4,949,942 | 8/1990 | Shoda | 144/1 A |
| 5,094,282 | 3/1992 | Suzuki et al. | 144/1 A |
| 5,203,547 | 4/1993 | Makumo | 269/21 |

FOREIGN PATENT DOCUMENTS

| 80141 | 7/1981 | Japan | 269/21 |
|---|---|---|---|
| 155336 | 8/1985 | Japan | 269/21 |
| 312035 | 12/1988 | Japan | 269/21 |

*Primary Examiner*—W. Donald Bray
*Attorney, Agent, or Firm*—Burgess, Ryan and Wayne

[57] ABSTRACT

A suction table has a compartment for sucking a sacrifice board in periphery and a compartment for sucking a process board in inner portion. Therefore, when the process board is positioned on the sacrifice board, the air is not leaked from suction holes of the sacrifice board for sucking the process board and suction loss is improved.

3 Claims, 5 Drawing Sheets

SUCTION TABLE APPARATUS OF A NUMERICAL CONTROL ROUTER

BACKGROUND OF THE INVENTION

The present invention relates to a suction table apparatus of a numerical control router having one or more compartments for a sacrifice board and one or more compartments for a process board because of improvement of suction loss.

In a prior suction table apparatus of a numerical control router, the suction table is hollow, on which a reinforced wood plate is mounted, and an electromagnetic valve is connected to a pipe of the suction table and a vacuum pump is connected to the pipe.

Generally, a sacrifice board is mounted on the suction table and the process board is fixed on the sacrifice board and is processed by a process head of a numerical control router. In the above suction table apparatus, the sacrifice board is the same size of the suction table and a plurality as suction holes are formed in the sacrifice board. Accordingly, because the air is sucked from the suction holes of the sacrifice board for the process board while the process board is positioned on the table, the loss of suction becomes large and the process board cannot be precisely positioned on the sacrifice board.

When the process employed on the process board fixed on the sacrifice board terminates, the suction on the process board is released by cutting off the electromagnetic valve and the process board is taken off of the sacrifice board. Because there is only one compartment of the suction table when the electromagnetic valve is cut off, the suction of the sacrifice board is released. Therefore, when the process board is carried out on the sacrifice board, the sacrifice board is shifted and a gap between the suction table and the sacrifice board is formed and chips move into the gap. Accordingly uniform manufactured articles cannot be made.

SUMMARY OF THE INVENTION

It is, therefore, the primary object of the present invention to respectively provide one or more compartments for the sacrifice board and the process board to reduce the suction loss.

In order to accomplish the above and other objects, the present invention comprises a head structure provided with one or more heads having a main shaft motor with a rotary shaft for fixing a tool of a drill or cutter, the head structure being moved on a rail, a suction table for fixing a sacrifice board and a process board which is moved at a right angle to the movement of the head structure, the suction table having a compartment for the sacrifice board in a peripheral portion thereof and having a compartment for the process board in an inner portion thereof, an electromagnetic valve connected to the compartments for the sacrifice board and the process board, and a vacuum device connected through a pipe to the electromagnetic valve.

DESCRIPTION OF THE PREFERRED EMBODIMENTS

Figure 1:
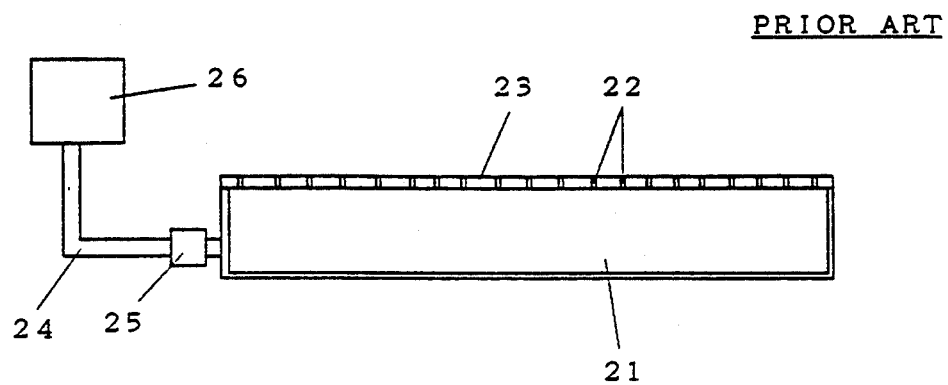
FIG. 1 shows a cross-sectional view of a prior suction table.

As shown in FIG. 1, in a prior suction table apparatus of a numerical control router, the suction table 21 is hollow, on which a reinforced wood plate 23 having a plurality of holes is mounted, and an electromagnetic valve 25 is connected to a pipe 24 of the suction table 21 and a vacuum pump 26 is connected to the pipe 24.

Generally, a sacrifice board is mounted on the suction table 21 and the process board is fixed on the sacrifice board and is processed by a process head of a numerical control router. In the above suction table apparatus, the sacrifice board is the same size as the suction table 21 and a plurality of suction holes are formed in the suction and the sacrifice boards. Accordingly, because the air is sucked from the suction holes of the sacrifice board for the process board while the process board is positioned on the sacrifice board, the loss of suction becomes large and the process board cannot be precisely positioned on the sacrifice board.

When the process employed on the process board fixed on the sacrifice board terminates, the suction on the process board is released by cutting off the electromagnetic valve 25 and the process board is taken off of the sacrifice board. Because there is only one compartment of the suction table 21, when the electromagnetic valve 25 is cut off, the suction of the sacrifice board is released. Therefore, when the process board is carried off the sacrifice board, a sacrifice board is shifted and the gap between the suction table 21 and the sacrifice board is formed and chips move into the gap. Accordingly uniform manufactured articles cannot be made.

Figure 2:
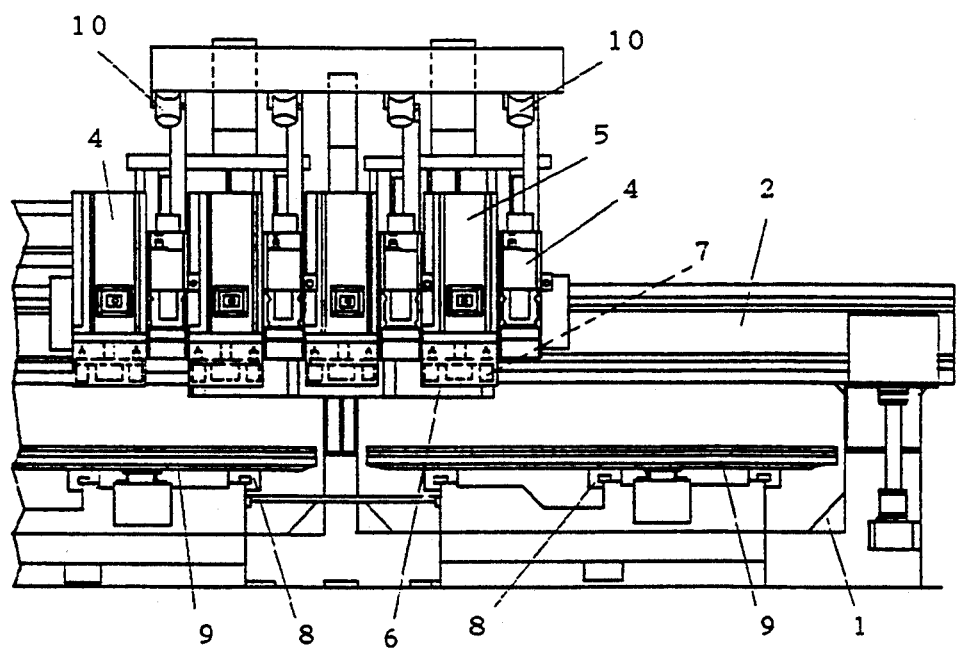
FIG. 2 shows a front view of a numerical control router of an embodiment of the present invention.
Figure 3:
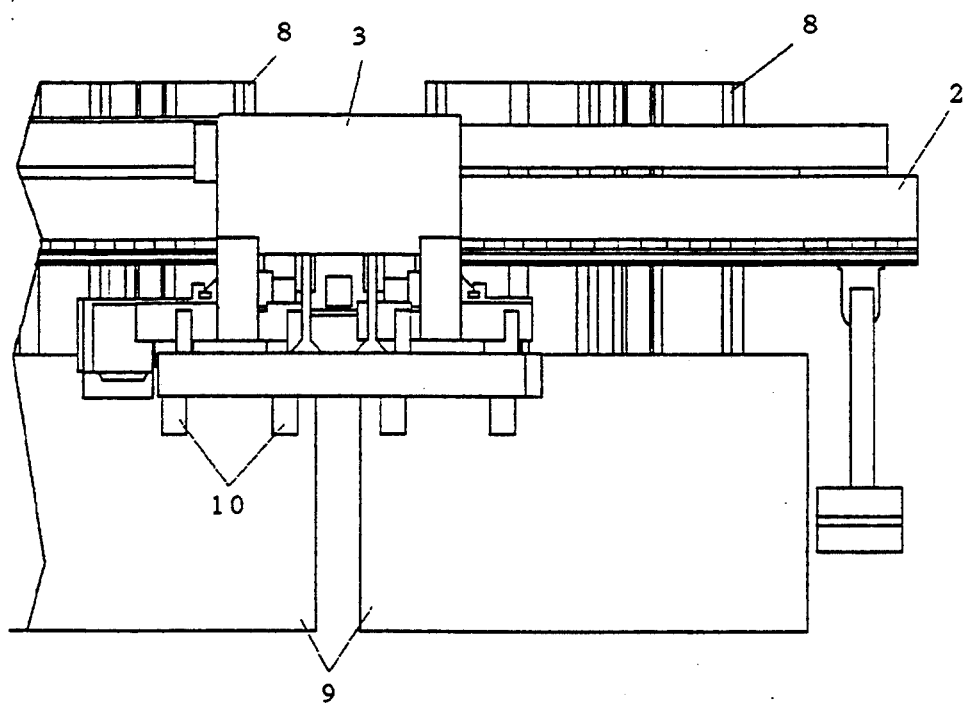
FIG. 3 shows a plane view of the numerical control router in FIG. 2.
Figure 4:
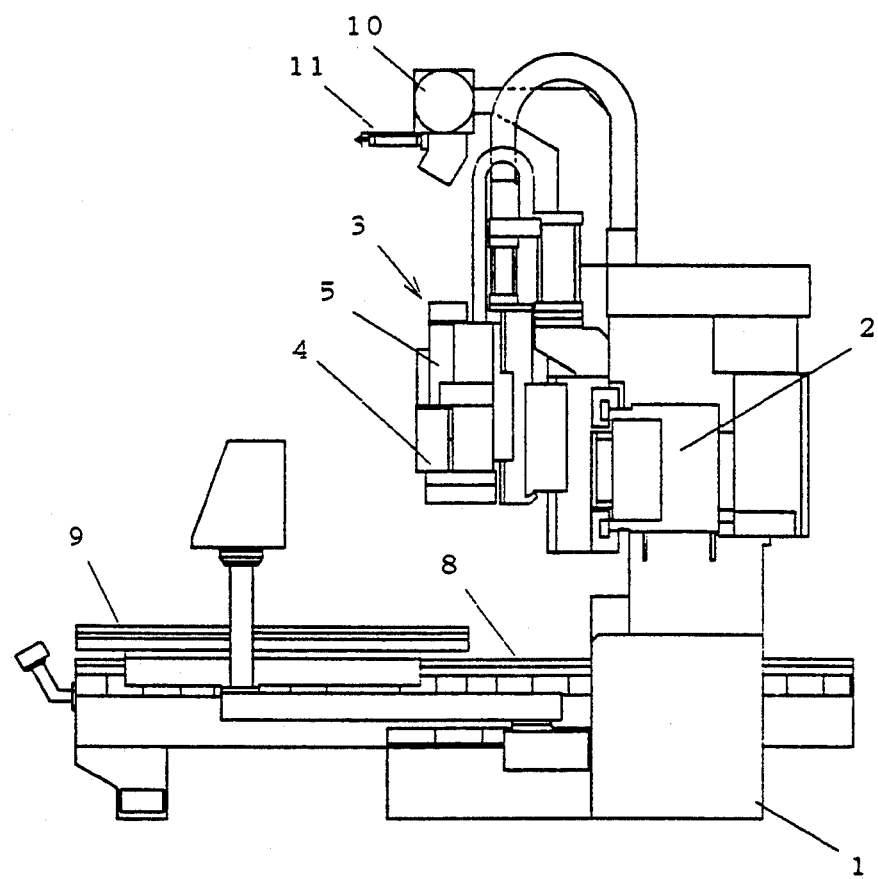
FIG. 4 shows a side view of the numerical control router in FIG. 2.

In FIGS. 2, 3 and 4, a rail 2 is provided with a supporting bed 1, and a head structure 3 is mounted on the rail 2 to move left and right in FIG. 2. A plurality of heads 4 (4 heads in FIG. 2) are attached to the head structure 3, motors are provided with the heads 4 and a tool such as a drill or cutter is attached to the rotary shaft of the motor.

A tool changer 5 and a tool magazine 6 having a plurality of tools 7 are attached to the side portion of the heads 4. Rails 8 are attached to the supporting bed 1 under the heads 4 and a suction table 9 is mounted on the rails 8 to move before and behind the heads 4. Ducts 10 are attached to the upper portion of the heads 4, valves (not shown) which open or close with cylinders 11 are attached to the ducts 10, hoses (not shown) are connected to the ducts 10 and to suck chips or dust off of the suction table 9.

Figure 5:
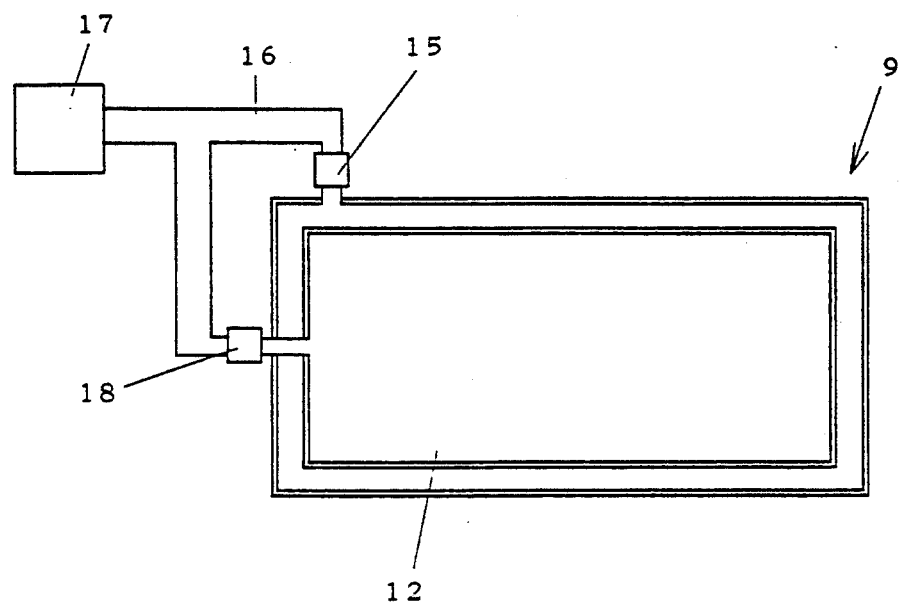
FIG. 5 shows a plane view of the suction table in FIG. 2 in which an upper plate is not shown.
Figure 6:
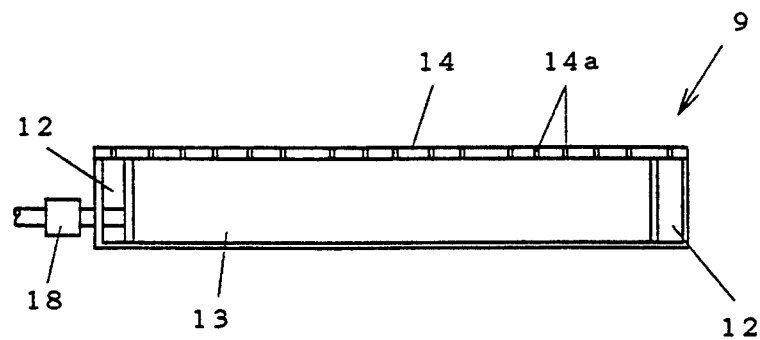
FIG. 6 shows a side cross-sectional view of the suction table in FIG. 2 in one embodiment of the present invention.

As shown in FIGS. 5 and 6, the suction table 9 forms a compartment 12 for the sacrifice board in the periphery of the suction table 9 and forms a compartment 13 in the inside of the suction table 9. A reinforced wood plate 14 having a plurality of suction holes 14a is connected over the compartments 12 and 13. The outer compartment for the sacrifice board 12 is connected through an electromagnetic valve 15 and a pipe 16 to a vacuum device 17 and the inner compartment 13 is connected through an electromagnetic value 18 to the vacuum device 17.

In the above suction table apparatus, when the sacrifice board having the suction holes corresponding to the size of the process board is positioned, the electromagnetic valve 15 is opened and the sacrifice board is sucked onto the reinforced wood plate 14 of the table 9 with the suction of the suction holes in the periphery of the reinforced wood plate 14.

Also, when the process board is the same as the sacrifice board, the electromagnetic valve 18 is opened and the process board is positioned on the sacrifice board.

In the embodiments of the present invention, because the compartment of the suction table 9 is divided into the compartment 12 for sucking the the sacrifice board and the compartment 13 for sucking process board, the air cannot leak from the suction holes for sucking the process board while the sacrifice board is positioned on the loss of suction table 9 and the suction is reduced. Also, after the sacrifice board is positioned on the suction table 9, the process board is precisely positioned on the sacrifice board.

Figure 7:
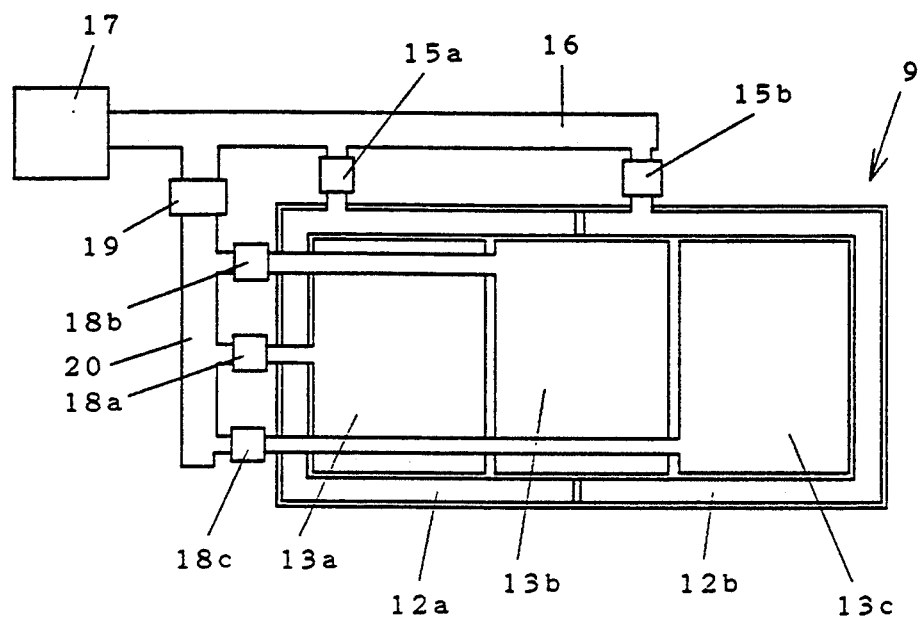
FIG. 7 shows a plane view of the suction table in FIG. 2 in which an upper plate is not shown according to another embodiment of the present invention.
Figure 8:
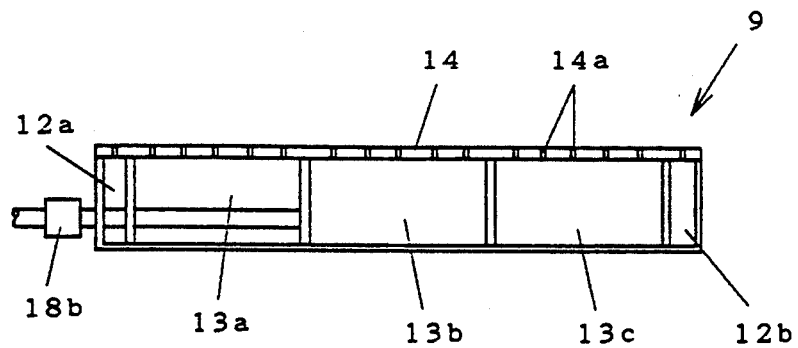
FIG. 8 shows a side cross-sectional view of the suction table of FIG. 7.

As shown in FIGS. 7 and 8, in the suction table apparatus of another embodiment of the present invention, the suction table 9 forms compartments 12a and 12b for the sacrifice board in the periphery of the suction table 9 and forms compartments 13a, 13b and 13c in the inside of the suction table 9. A reinforced wood plate 14 having a plurality of suction holes 14a is connected over the compartments 12b, 13a, 13b and 13c. The compartments 12a and 12b for sacrifice board 12a are connected through electromagnetic valves 15a and 15b and pipes 16 to a vacuum device 17 and the compartments for 13a, 13b and 13c are connected through electromagnetic valves 18a, 18b and 18c, a pipe 20 and a main electromagnetic valve 19 to the vacuum device 17.

In the above suction table apparatus, when the sacrifice board having the suction holes corresponding to the size of the process board is positioned, each or all of the electromagnetic valves 15a and 15b are opened and the sacrifice board is sucked onto the reinforced wood plate 14 of the table 9 with the suction of the suction hole in the periphery of the reinforced wood plate 14.

When the process board is smaller than a half of the suction table 9, one of the electromagnetic valves 18a, 18b and 18c is opened, the process board is sucked onto each of the compartments 13a, 13b and 13c smaller than the half portion of the sacrifice board.

Also, when the process board is the same size as the sacrifice board, the electromagnetic valves 18a, 18b and 18c are all opened and the process board is positioned on the sacrifice board.

In the embodiments of the present invention, because the compartment of the suction table 9 is divided into the compartments 12a and 12b for sucking the sacrifice board and the compartments 13a, 13b and 13c for sucking the process board, the air cannot leak from the suction holes for sucking the process board while the sacrifice board is positioned on the suction table 9 and the loss of suction is therefore reduced. Also, after the sacrifice board is positioned on the suction table 9, the process board is precisely positioned on the sacrifice board.

The main electromagnetic valve 19 can hold the pressure of the predetermined value in the compartments 12a and 12b for the sacrifice board by closing the electromagnetic valves 18a, 18b and 18c after the electromagnetic valve 19 is closed. Also, when the process board is the same size as the sacrifice board, the positioning or removing of the process board is performed by the electromagnetic valve 19 without using the electromagnetic valves 18a, 18b and 18c.

In the present invention, because the compartment for sucking the sacrifice board and the compartment for sucking the process board are provided with the suction table, the sacrifice board is precisely positioned on the suction table and the sacrifice board is precisely positioned on the sacrifice board without loss of suction.

What is claimed is:

1. A suction table apparatus of a numerical control router comprising:
   a head structure provided with at least one head having a main shift motor with a rotary shaft for fixing a tool thereon, rail means for moving the head structure,
   suction table means for fixing a sacrifice board and a process board thereon, said suction table means being moveable at a right angle to movement of the head structure, the suction table means having a compartment for holding the sacrifice board on a peripheral portion thereof and having a compartment for holding the process board on an inner portion thereof,
   electromagnetic valves respectively connected to the compartments for the sacrifice board and the process board, and
   vacuum means connected to the compartments through the electromagnetic valves for holding the sacrifice board and process board on the suction table.

2. A suction table apparatus of a numerical control router comprising
   a head structure provided with at least one head having a main shaft motor with a rotary shaft for fixing a tool thereon,
   rail means for moving the head structure,
   a suction table means for fixing a sacrifice board and a process board thereon, said suction table means being moveable at a right angle to movement of the head structure, the suction table means having at least two compartments for holding the sacrifice board on a peripheral portion thereof and having at least two compartments for holding the process board on an inner portion thereof,
   electromagnetic valves respectively connected to the compartments for the sacrifice board and to the compartments for the process board, and
   vacuum means connected to the compartments through the electromagnetic valves for holding the sacrifice board and process board on the suction table.

3. A suction table apparatus of a numerical control router as set forth in claim 2 wherein a main electromagnetic valve is inserted between the vacuum means and the mentioned electromagnetic valves.

* * * * *